(12) United States Patent
Kuo et al.

(10) Patent No.: US 11,262,819 B2
(45) Date of Patent: Mar. 1, 2022

(54) ELECTRONIC DEVICE

(71) Applicant: HTC Corporation, Taoyuan (TW)

(72) Inventors: Chih-Yao Kuo, Taoyuan (TW);
Chin-Kai Sun, Taoyuan (TW);
Chung-Chiao Tan, Taoyuan (TW);
Tung-Hsin Yeh, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 17/013,875

(22) Filed: Sep. 8, 2020

(65) Prior Publication Data

US 2021/0216119 A1   Jul. 15, 2021

Related U.S. Application Data

(60) Provisional application No. 62/958,723, filed on Jan. 9, 2020.

(51) Int. Cl.
*G06F 1/20* (2006.01)
*H05K 7/20* (2006.01)
*H01L 23/467* (2006.01)

(52) U.S. Cl.
CPC ............ *G06F 1/203* (2013.01); *H01L 23/467* (2013.01); *H05K 7/20172* (2013.01)

(58) Field of Classification Search
CPC . G06F 1/203; G06F 1/20; G06F 1/206; G06F 1/1626; G06F 1/1628; G06F 1/181; H05K 7/20145; H05K 7/20154; H05K 7/20172; H05K 5/0213; H05K 7/20136; H05K 7/20163; H05K 7/20972; H05K 5/03; H05K 7/202; H05K 7/20209; H05K 7/20336; H05K 5/0086; H05K 5/0217; H05K 7/20; H05K 7/20909; H05K 9/0007;

(Continued)

(56) References Cited

U.S. PATENT DOCUMENTS 5,810,554 A * 9/1998 Yokozawa ............ F04D 29/582
                                                    415/176
6,430,042 B1 * 8/2002 Ohashi ..................... G06F 1/203
                                                    165/104.33

(Continued)

FOREIGN PATENT DOCUMENTS

CN       103492973      1/2014
JP       2004039861     2/2004

(Continued)

OTHER PUBLICATIONS

"Office Action of Taiwan Counterpart Application", dated Oct. 18, 2021, p. 1-p. 3.

*Primary Examiner* — Michael A Matey
(74) *Attorney, Agent, or Firm* — JCIPRNET

(57) ABSTRACT

An electronic device includes a casing, a motherboard, a battery, a fan, and a heat dissipation module. The motherboard is arranged in the casing, and defines a first space with the casing. The battery is arranged in the casing and defines a second space with the motherboard. The motherboard separates the first space and the second space. The fan is arranged in the casing and has a first airflow outlet and a second airflow outlet independent of the first airflow outlet. The first airflow outlet communicates with the first space and the second space. The heat dissipation module is arranged in the casing and transfers heat from the motherboard to the second airflow outlet.

14 Claims, 5 Drawing Sheets

(58) Field of Classification Search
CPC ............ G02F 1/133385; H04M 1/026; H04M 1/0262; H01L 23/467
See application file for complete search history.

(56) References Cited

U.S. PATENT DOCUMENTS

| | | | | |
|---|---|---|---|---|
| 6,567,269 | B2* | 5/2003 | Homer | G06F 1/203 165/80.4 |
| 6,801,430 | B1* | 10/2004 | Pokharna | G06F 1/203 165/80.2 |
| 2004/0125558 | A1* | 7/2004 | DiStefano | G06F 1/203 361/679.48 |
| 2006/0078428 | A1* | 4/2006 | Zheng | F04D 29/444 415/206 |
| 2006/0087815 | A1* | 4/2006 | Lanni | H05K 7/20136 361/695 |
| 2007/0076370 | A1* | 4/2007 | Mongia | H01L 23/467 361/690 |
| 2007/0183126 | A1* | 8/2007 | Tilton | H01L 23/4735 361/699 |
| 2008/0180910 | A1* | 7/2008 | Tomioka | G06F 1/203 361/695 |
| 2009/0324403 | A1* | 12/2009 | Zheng | F04D 25/0613 415/203 |
| 2013/0225065 | A1* | 8/2013 | Lee | H04M 1/0202 454/343 |
| 2014/0063726 | A1* | 3/2014 | Liu | G06F 1/20 361/679.33 |
| 2014/0233183 | A1* | 8/2014 | Horng | G06F 1/203 361/692 |
| 2014/0235156 | A1* | 8/2014 | Li | G06F 1/203 454/184 |
| 2015/0009625 | A1* | 1/2015 | Chin | G02F 1/133382 361/695 |
| 2015/0017905 | A1* | 1/2015 | Li | G06F 1/203 454/184 |
| 2015/0195952 | A1* | 7/2015 | Tsunoda | H05K 7/20163 361/697 |
| 2017/0083061 | A1* | 3/2017 | Stellman | H01L 23/467 |
| 2018/0027672 | A1* | 1/2018 | Cho | H04N 5/64 361/697 |
| 2019/0196560 | A1* | 6/2019 | Cha | H04M 1/0279 |
| 2020/0146178 | A1* | 5/2020 | Horng | H05K 7/20136 |
| 2020/0275584 | A1* | 8/2020 | Chiang | H05K 7/20736 |
| 2020/0367383 | A1* | 11/2020 | Moon | H05K 7/2039 |
| 2021/0185854 | A1* | 6/2021 | Sui | H05K 7/20909 |

FOREIGN PATENT DOCUMENTS

| | | |
|---|---|---|
| TW | 455054 | 9/2001 |
| TW | 201407314 | 2/2014 |
| TW | 201422125 | 6/2014 |

\* cited by examiner

ELECTRONIC DEVICE

CROSS-REFERENCE TO RELATED APPLICATION

This application claims the priority benefit of U.S. provisional application Ser. No. 62/958,723, filed on Jan. 9, 2020. The entirety of the above-mentioned patent application is hereby incorporated by reference herein and made a part of this specification.

BACKGROUND

Field of the Disclosure

The disclosure relates to an electronic device, and particularly relates to an electronic device with a fan.

Description of Related Art

With the development of mobile network generations from 3G, 4G to 5G, data transmission rate is gradually increasing. However, compared with 4G-specific electronic products (such as mobile network routers, smart phones, etc.), the heating generation rate of 5G-specific electronic products also becomes higher and higher, so fans are required to facilitate heat dissipation.

SUMMARY OF THE DISCLOSURE

The disclosure provides an electronic device which provides good self heat dissipation performance.

An electronic device includes a casing, a motherboard, a battery, a fan, and a heat dissipation module. The motherboard is arranged in the casing, and defines a first space with the casing. The battery is arranged in the casing and defines a second space with the motherboard. The motherboard separates the first space and the second space. The fan is arranged in the casing and has a first airflow outlet and a second airflow outlet independent of the first airflow outlet. The first airflow outlet communicates with the first space and the second space. The heat dissipation module is arranged in the casing and transfer heat from the motherboard to the second airflow outlet.

Based on the above, in the disclosure, the fan outputs the airflow to the first space defined by the motherboard and the casing and the second space defined by the motherboard and the battery through the first airflow outlet, thereby facilitating heat dissipation for the components above the motherboard and reduce the effect of heat generated by the motherboard to the performance of battery under the motherboard.

DESCRIPTION OF EMBODIMENTS

Figure 1:
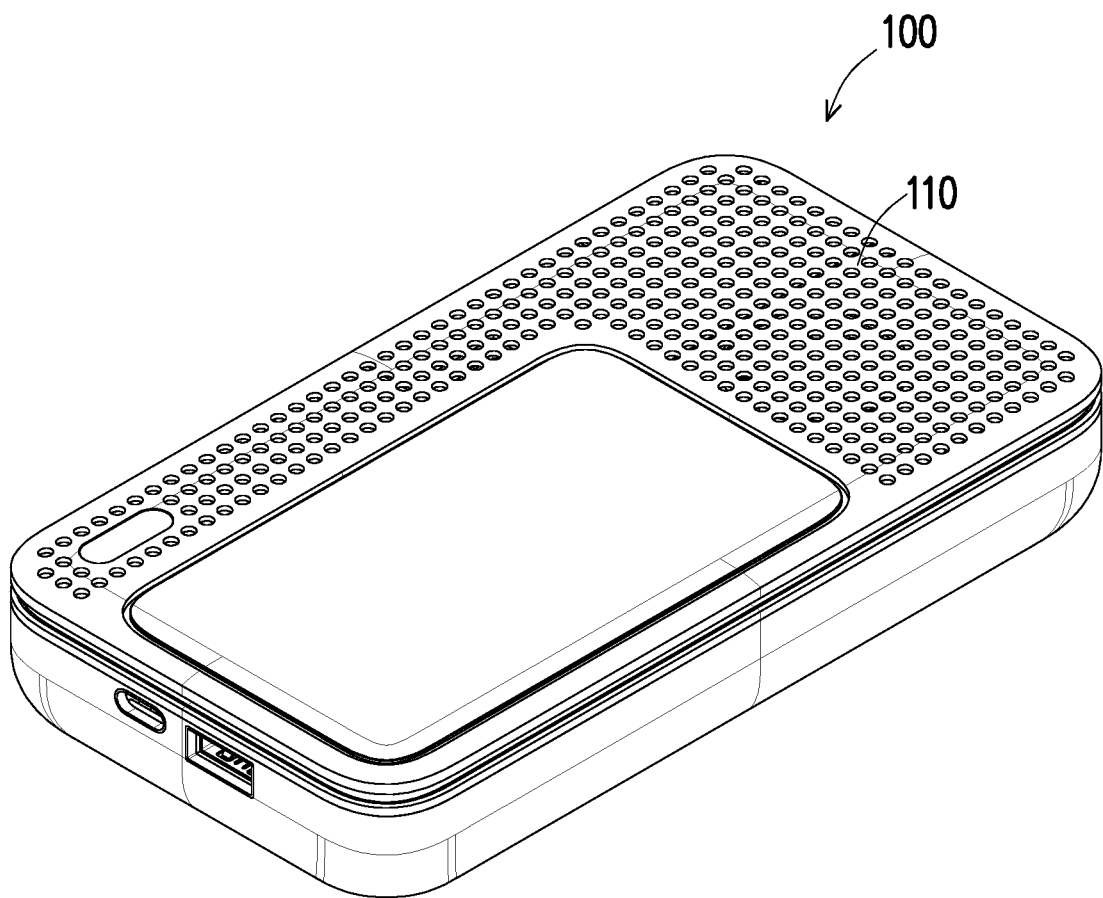
FIG. 1 is a perspective top view of an electronic device according to an embodiment of the disclosure.
Figure 2:
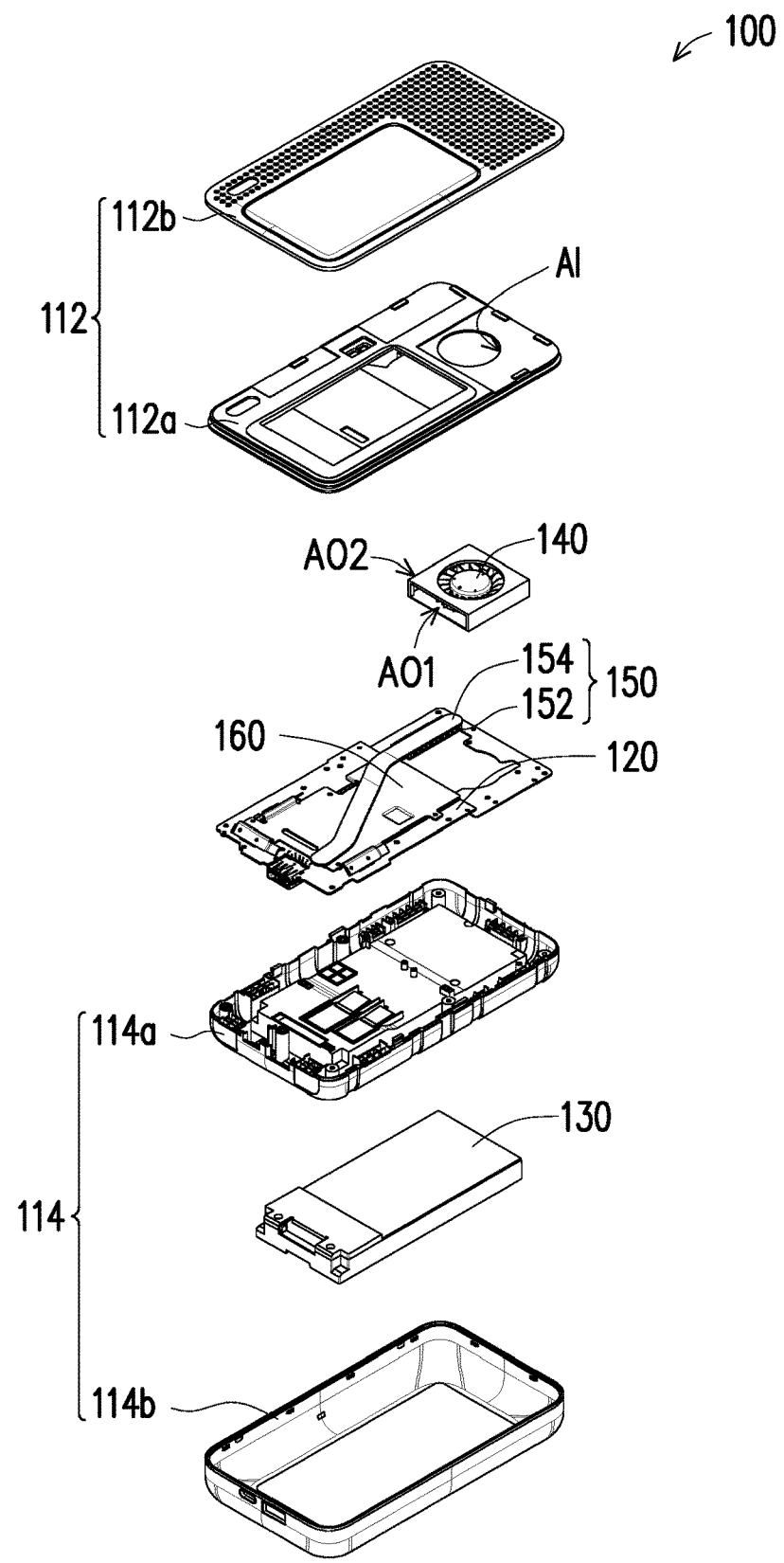
FIG. 2 is a perspective exploded top view of the electronic device of FIG. 1.
Figure 3:
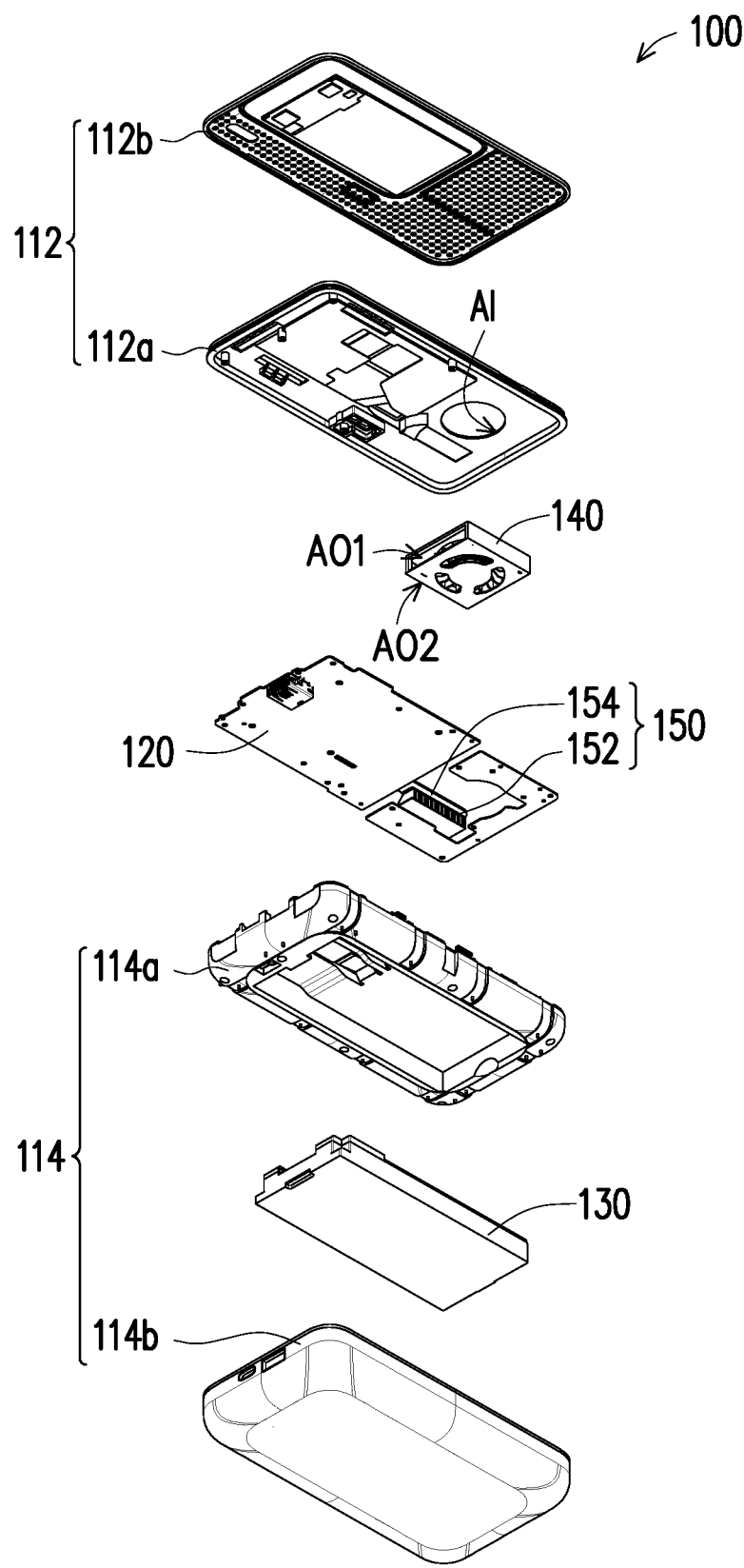
FIG. 3 is a perspective exploded bottom view of the electronic device of FIG. 1.
Figure 4:
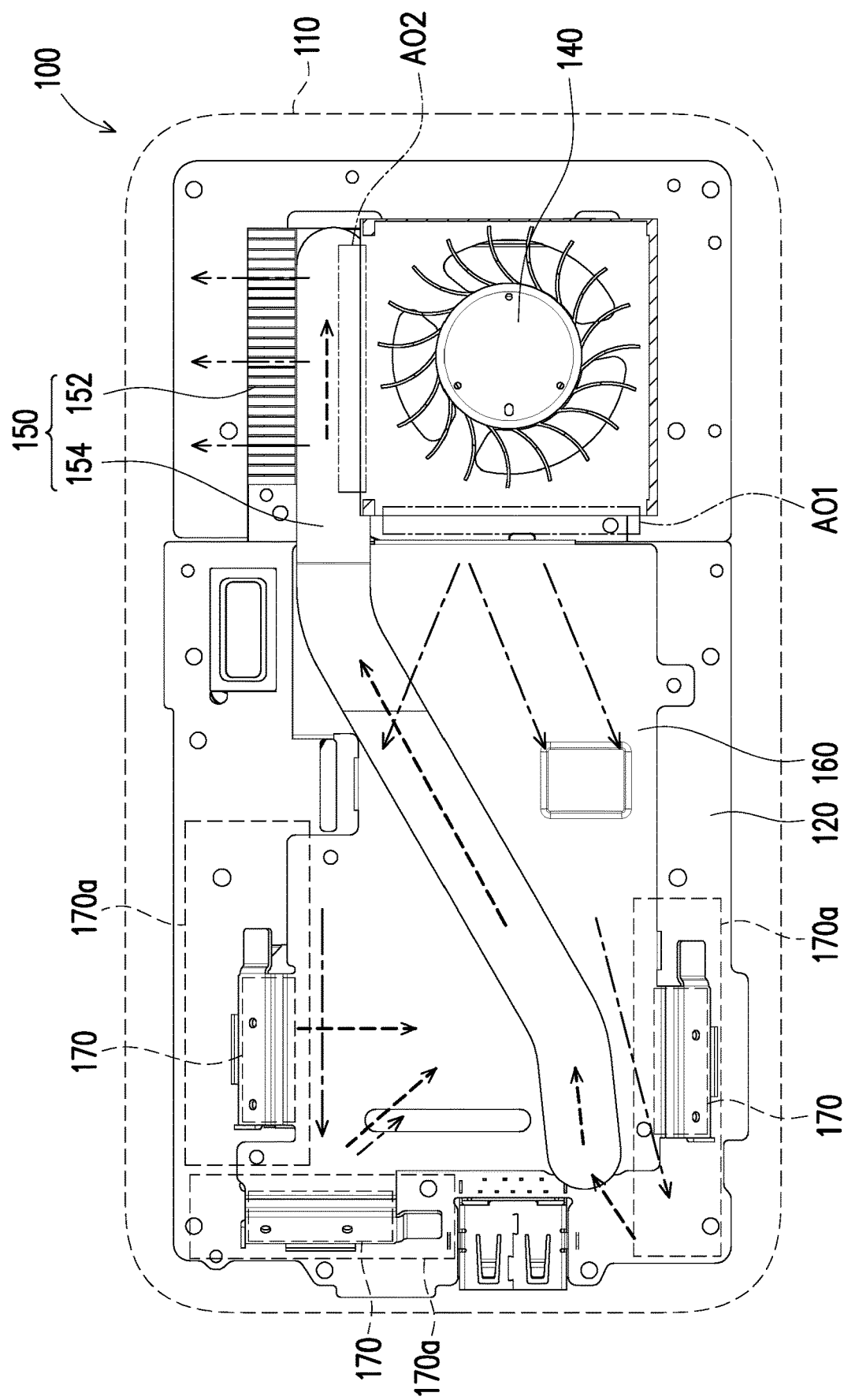
FIG. 4 is a top view of the electronic device of FIG. 1 with a casing removed.

Please refer to FIG. 1 to FIG. 5. In this embodiment, the electronic device 100 is, for example, a network router, a smart phone, etc. The electronic device 100 includes a casing 110, a motherboard 120, a battery 130, a fan 140 and a heat dissipation module 150. The motherboard 120 is disposed in the casing 110 and defines a first space SP1 with the casing 110. The battery 130 is disposed in the casing 110 and defines a second space SP2 with the motherboard 120. The motherboard 120 separates the first space SP1 and the second space SP2. The fan 140 is arranged in the casing 110 and has a first airflow outlet AO1 and a second airflow outlet AO2 independent of the first airflow outlet AO1. In FIG. 4, the top plate of the fan 140 is removed to clearly show the positions of the first airflow outlet AO1 and the second airflow outlet AO2. The first airflow outlet AO1 communicates with the first space SP1 and the second space SP2. The heat dissipation module 150 is disposed in the casing 110 and transfers heat from the motherboard 120 to the second airflow outlet AO2.

Figure 5:
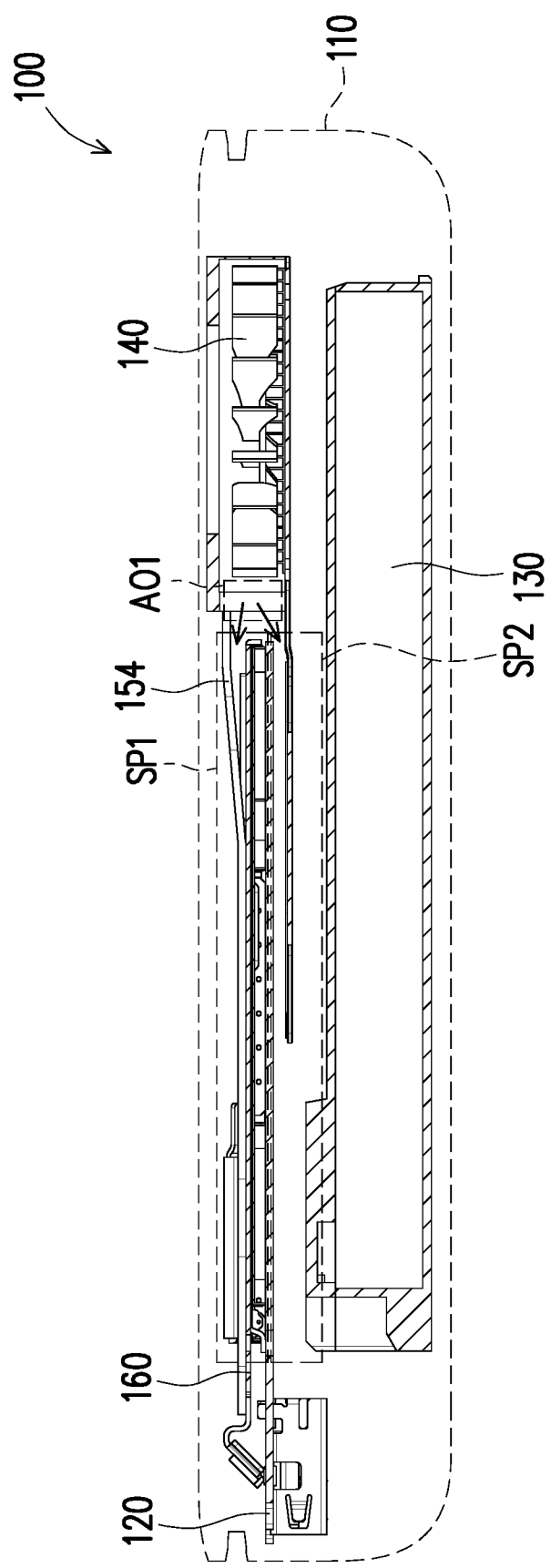
FIG. 5 is a longitudinal cross-sectional view of the electronic device of FIG. 1 with a casing removed.

Referring to FIG. 5, since the first airflow outlet AO1 communicates with the first space SP1 and the second space SP2, the fan 140 can drive the airflow to flow from the first airflow outlet AO1 to the first space SP1 and the second space SP2. Therefore, the airflow flowing through the first space SP1 can facilitate the heat dissipation for the components (not shown) arranged above the motherboard 120, and the airflow flowing through the second space SP2 can reduce the effect of the heat generated by the electronic components arranged on the motherboard 120 to the performance of the battery 130.

Please refer to FIG. 1 to FIG. 5. In this embodiment, the casing 110 may include an upper casing 112 and a lower casing 114 connected to the upper casing 112. Specifically, the upper casing 112 may include an upper bezel 112a and an upper cover 112b mounted to the upper bezel 112a. The upper bezel 112a may have an airflow inlet AI, and the upper cover 112b may have a plurality of openings, and the openings communicate with the airflow inlet AI. The lower casing 114 may include a lower bezel 114a and a lower cover 114b mounted to the lower bezel 114a.

Please refer to FIG. 2 to FIG. 5, in this embodiment, the heat dissipation module 150 may include a heat dissipation element 152 (such as a fin heat sink, etc.) and a heat transfer element 154 (such as a heat pipe, a vapor chamber, etc.). The heat dissipation element 152 may be disposed in the casing 110 and adjacent to the second airflow outlet AO2. The heat transfer element 154 may be disposed in the casing 110 and thermally contact the motherboard 120 and the heat dissipation element 152 to transfer heat from the motherboard 120 to the heat dissipation element 152. In addition, a part of the heat transfer element 154 may extend obliquely in the first space SP1 to divert the airflow from the first airflow outlet AO1. It should be noted that the flow direction or tendency of the airflow (as shown by arrow drawn in dashed line in FIG. 4) output from the first airflow outlet AO1 is opposite to the heat transfer direction or tendency of the heat transfer element 154 (as shown by arrow drawn in dotted line in FIG. 4).

Please refer to FIGS. 2 to 5, in this embodiment, the electronic device 100 may further include a metal bezel 160. The metal bezel 160 may be disposed in the casing 110 and thermally contact the motherboard 120 and the heat transfer element 154 to transfer heat from the motherboard 120 to the heat dissipation element 152. The metal bezel 160 may be located in the first space SP1 defined by the casing 110 and the motherboard 120. In addition, a part of the heat transfer element 154 extends obliquely on the metal bezel 160 to guide the airflow from the first airflow outlet AO1. In addition, a part of the heat transfer element 154 is inclined on the metal bezel 160 and gradually extends away from the metal bezel 160 to guide and divert the airflow from the first airflow outlet AO1.

Please refer to FIG. 4, in this embodiment, the electronic device 100 may further include one or more antenna modules 170, such as mmWave modules. The antenna module 170 is disposed in the casing 110 and has an antenna clearance region 170a. The antenna module 170 is arranged in the casing 110 through being mounted on the metal bezel 160, and the metal bezel 160 is located outside the antenna clearance region 170a. Therefore, the heat energy generated by the antenna module 170 can reach the heat dissipation element 152 through the metal bezel 160 and the heat transfer element 154.

In more detail, part of the airflow from the first airflow outlet AO1 flows through the gap between the heat transfer element 154 and the metal bezel 160 and goes to the region where the two adjacent antenna modules 170 are located (as shown by the upper left corner in FIG. 4). Part of the airflow from the first airflow outlet AO1 is guided by the heat transfer element 154 to flow toward the antenna module 170 located at the end of the heat transfer element 154 (as shown by the lower left corner in FIG. 4). Therefore, the airflow from the first airflow outlet AO1 can dissipate heat for the three antenna modules 170 located at different positions.

In summary, in the disclosure, the fan outputs the airflow to the first space defined by the motherboard and the casing and the second space defined by the motherboard and the battery through the first airflow outlet, thereby facilitating heat dissipation for the components above the motherboard and reduce the effect of heat generated by the electronic components arranged on the motherboard to the performance of battery under the motherboard.

What is claimed is:

1. An electronic device, comprising:
   a casing;
   a motherboard arranged in the casing and defining a first space with the casing;
   a battery arranged in the casing and defining a second space with the motherboard, wherein the motherboard separates the first space and the second space;
   a fan arranged in the casing and having a first airflow outlet and a second airflow outlet independent of the first airflow outlet, wherein the first airflow outlet communicates with the first space and the second space; and
   a heat dissipation module arranged in the casing and transferring heat from the motherboard to the second airflow outlet.

2. The electronic device according to claim 1, wherein the casing comprises an upper casing and a lower casing connected with the upper casing.

3. The electronic device according to claim 2, wherein the upper casing comprises an upper bezel and an upper cover mounted on the upper bezel, the upper bezel has an airflow inlet, the upper cover has a plurality of openings, and the openings communicate with the airflow inlet.

4. The electronic device according to claim 2, wherein the lower casing comprises a lower bezel and a lower cover mounted on the lower bezel.

5. The electronic device according to claim 1, wherein the heat dissipation module comprises:
   a heat dissipation element arranged in the casing and adjacent to the second airflow outlet; and
   a heat transfer element arranged in the casing and thermally contacting the motherboard and the heat dissipation element to transfer heat from the motherboard to the heat dissipation element.

6. The electronic device according to claim 5, wherein a part of the heat transfer element extends obliquely in the first space to divert airflow from the first airflow outlet.

7. The electronic device according to claim 5, further comprising:
   a metal bezel arranged in the casing and thermally contacting the motherboard and the heat transfer element to transfer heat from the motherboard to the heat dissipation element.

8. The electronic device according to claim 7, wherein the metal bezel is located in the first space defined by the casing and the motherboard.

9. The electronic device according to claim 8, wherein a part of the heat transfer element extends obliquely on the metal bezel to guide airflow from the first airflow outlet.

10. The electronic device according to claim 8, wherein a part of the heat transfer element is inclined on the metal bezel and gradually extends away from the metal bezel to guide and divert airflow from the first airflow outlet.

11. The electronic device according to claim 1, further comprising:
    an antenna module arranged in the casing and having an antenna clearance region.

12. The electronic device according to claim 11, wherein the antenna module is a mmWave module.

13. The electronic device according to claim 5, further comprising:
    an antenna module arranged in the casing and having an antenna clearance region; and
    a metal bezel arranged in the casing, and thermally contacting the motherboard and the heat transfer element to transfer heat from the motherboard to the heat dissipation element, wherein the antenna module is arranged in the casing through being mounting on the metal bezel, and the metal bezel is located outside the antenna clearance region.

14. The electronic device according to claim 13, wherein the antenna module is a mmWave module.

\* \* \* \* \*